(12) United States Patent
de Fresart et al.

(10) Patent No.: US 7,074,681 B2
(45) Date of Patent: Jul. 11, 2006

(54) SEMICONDUCTOR COMPONENT AND METHOD OF MANUFACTURING

(75) Inventors: Edouard D. de Fresart, Tempe, AZ (US); Patrice Parris, Phoenix, AZ (US); Richard Joseph De Souza, Tempe, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/614,553

(22) Filed: Jul. 7, 2003

(65) Prior Publication Data

US 2004/0097019 A1 May 20, 2004

Related U.S. Application Data

(63) Continuation of application No. 09/893,025, filed on Jun. 27, 2001, now abandoned.

(51) Int. Cl.
*H01L 21/336* (2006.01)
(52) U.S. Cl. .................. 438/294; 438/295; 438/296
(58) Field of Classification Search ............... 438/294, 438/295, 296
See application file for complete search history.

(56) References Cited

U.S. PATENT DOCUMENTS

| 4,300,150 A | 11/1981 | Colak |
| 5,523,601 A | 6/1996 | Yanagigawa |
| 5,539,238 A | 7/1996 | Malhi |
| 5,801,431 A | 9/1998 | Ranjan |
| 5,844,275 A * | 12/1998 | Kitamura et al. ........... 257/335 |
| 5,852,314 A | 12/1998 | Depetro et al. |
| 6,025,231 A | 2/2000 | Hutter et al. |
| 6,069,396 A | 5/2000 | Funaki |
| 6,087,232 A * | 7/2000 | Kim et al. ............... 438/289 |
| 6,110,803 A | 8/2000 | Tung |
| 6,277,706 B1 * | 8/2001 | Ishikawa ................. 438/424 |
| 6,353,252 B1 * | 3/2002 | Yasuhara et al. .......... 257/487 |

FOREIGN PATENT DOCUMENTS

| DE | 195 35 140 A1 | 3/1996 |
| EP | 0 295 391 A1 | 4/1988 |
| EP | 0 741 416 A1 | 11/1996 |

OTHER PUBLICATIONS

Bergemont et al., "High Voltage Driver Built in a Low Voltage 0.18 μm CMOS for Cache Redundancy Applications in Microprocessors," *ISPSD*, May 22-25, 2000, Toulouse, France.
Kim et al., "A 650V rated RESURF-type LDMOS Employing an Internal Clamping Diode for Bulk Breakdown without EPI Layer," *Proceedings of 2001 International Symposium on Power Devices and ICs*, Osaka, Japan, Jun. 4-7, 2001, p. 347-350.
PCT/US02/18353 PCT Search Report mailed Apr. 15, 2003.

* cited by examiner

*Primary Examiner*—Trung Dang

(57) ABSTRACT

A semiconductor component includes a substrate (110) having a surface, a channel region (120, 220) located in the substrate, a non-electrically conductive region (130) substantially located below a substantially planar plane defined by the surface of the substrate, a drift region (140, 240) located in the substrate and between the channel region and the non-electrically conductive region, and an electrically floating region (150, 350, 450, 550) located in the substrate and contiguous with the non-electrically conductive region.

32 Claims, 4 Drawing Sheets

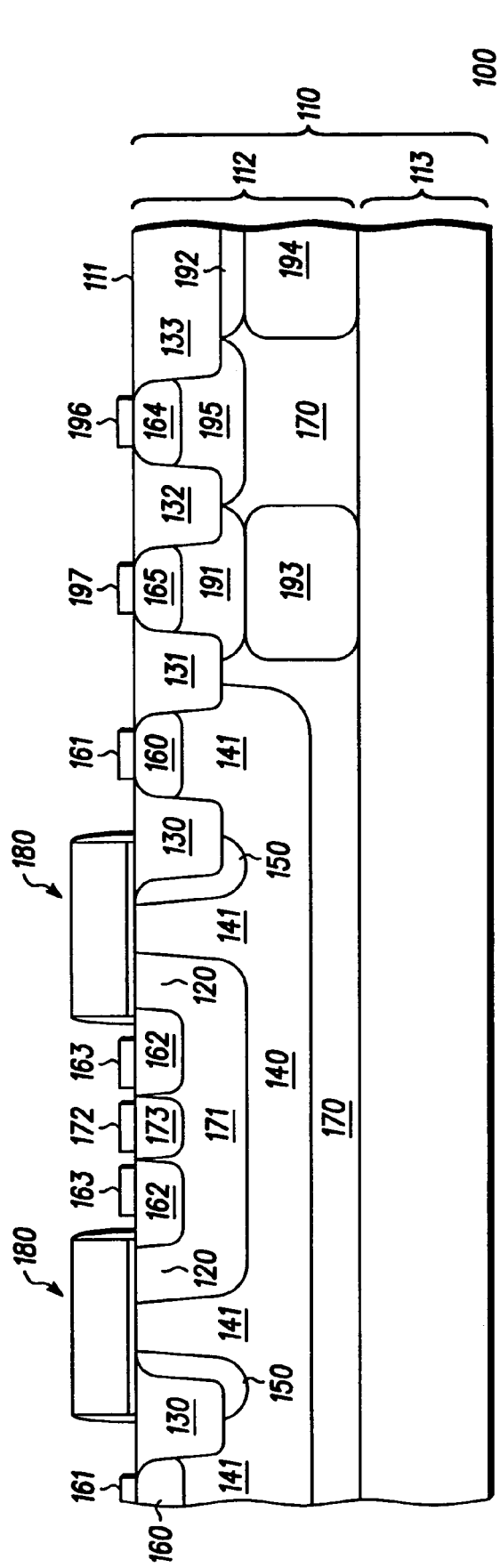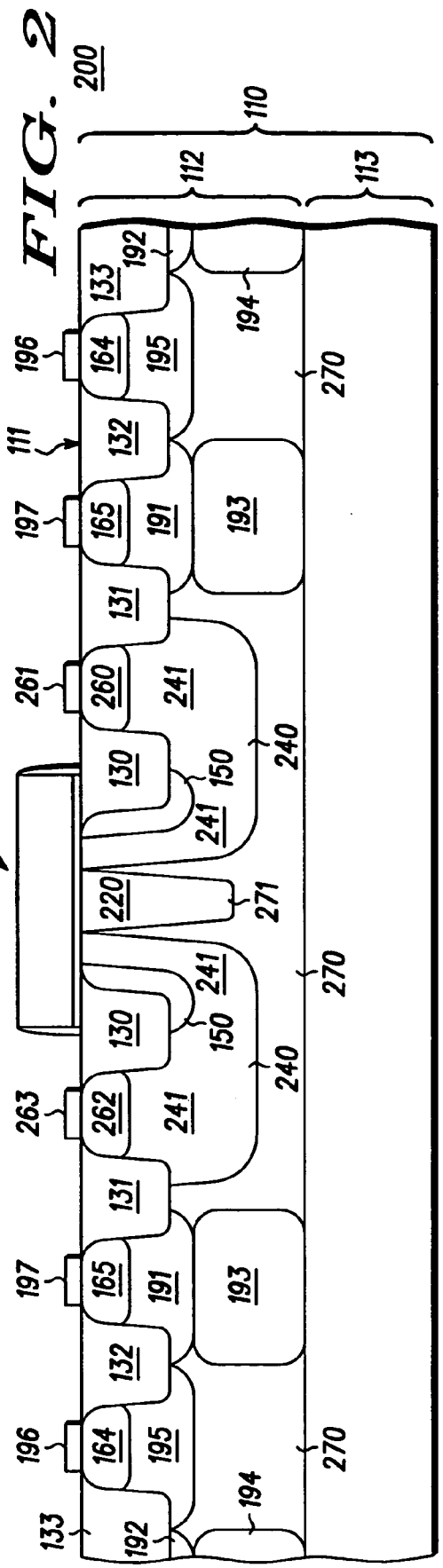

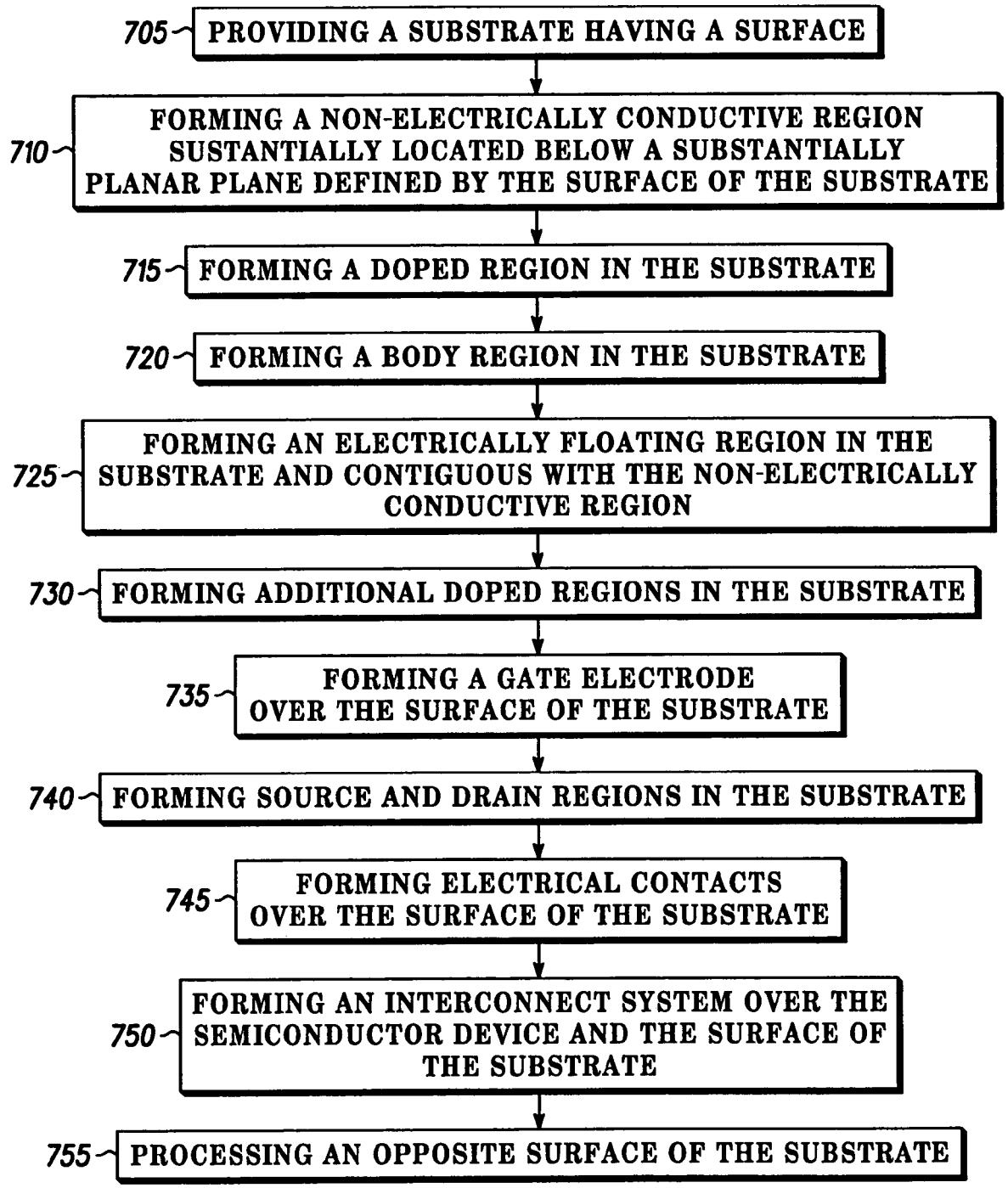

SEMICONDUCTOR COMPONENT AND METHOD OF MANUFACTURING

This application is a continuation of U.S application Ser. No. 09/893,025 filed on Jun. 27, 2001, now abandoned.

BACKGROUND OF THE INVENTION

This invention relates to electronics, in general, and to semiconductor components and methods of manufacturing, in particular.

Semiconductor components used in automotive applications typically have semiconductor devices with high breakdown voltages of greater than forty volts. These semiconductor devices occasionally use a REduced SURface Field (RESURF) technique, a trench drift structure, or both. Examples of these semiconductor devices are described in U.S. Pat. No. 5,539,238 and in German Patent Application Publication Number DE 195 35 140 A1. When these semiconductor devices are used in high voltage applications, however, these semiconductor devices have a high drain-to-source on-resistance and a low current drive capability.

Accordingly, a need exists for a semiconductor component and method of manufacturing that has a high breakdown voltage, a low drain-to-source on-resistance, and a high current drive capability.

BRIEF DESCRIPTION OF THE DRAWINGS

The invention will be better understood from a reading of the following detailed description, taken in conjunction with the accompanying drawing figures in which:

FIG. 1 illustrates a cross-sectional view of a portion of a semiconductor component in accordance with an embodiment of the invention;

FIG. 2 illustrates a cross-sectional view of a portion of a different semiconductor component in accordance with an embodiment of the invention;

FIG. 7 illustrates a flowchart for a method of manufacturing a semiconductor component in accordance with an embodiment of the invention.

Figure 3:
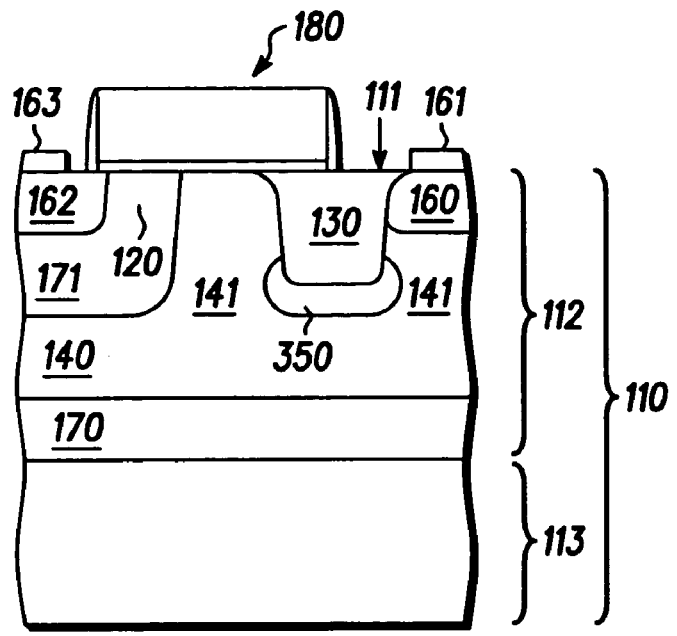
FIG. 3 illustrates a cross-sectional view of a portion of another semiconductor component in accordance with an embodiment of the invention.

For simplicity and clarity of illustration, the drawing figures illustrate the general manner of construction, and descriptions and details of well-known features and techniques are omitted to avoid unnecessarily obscuring the invention. Additionally, elements in the drawing figures are not necessarily drawn to scale, and the same reference numerals in different figures denote the same elements.

Furthermore, the terms first, second, third, fourth, and the like in the description and in the claims, if any, are used for distinguishing between similar elements and not necessarily for describing a sequential or chronological order. It is further understood that the terms so used are interchangeable under appropriate circumstances and that the embodiments of the invention described herein are capable of operation in other sequences than described or illustrated herein.

Moreover, the terms front, back, top, bottom, over, under, and the like in the description and in the claims, if any, are used for descriptive purposes and not necessarily for describing relative positions. It is understood that the terms so used are interchangeable under appropriate circumstances and that the embodiments of the invention described herein are capable of operation in other orientations than described or illustrated herein.

DETAILED DESCRIPTION OF THE DRAWINGS

A semiconductor component includes a trench drift structure in combination with a double RESURF structure. The semiconductor component can be a single or discrete semiconductor device, or the semiconductor component can be an integrated circuit having a plurality of semiconductor devices. In the preferred embodiment, the semiconductor device is an Ultra-High Voltage (UHV) or power Metal-Oxide-Semiconductor Field Effect Transistor (MOSFET) having a lateral structure.

Also in the preferred embodiment, the trench drift structure is located adjacent to a drain region of the semiconductor device. Further in the preferred embodiment, the trench drift structure is integrated in deep submicron technology using Shallow Trench Isolation (STI). Accordingly, the trench in the trench drift structure is preferably manufactured at the same time as the other STI structures in the device.

The trench in the trench drift structure is at least partially surrounded by an electrically floating ring or region that forms an upper RESURF layer in the double RESURF structure. A portion of the semiconductor substrate in which the device is located forms a lower RESURF layer in the double RESURF structure. A portion of a drift region in the trench drift structure is located between and is deflected by the upper and lower RESURF layers.

The combination of the trench drift structure and the double RESURF structure provides many advantages. For example, the combined structure increases the breakdown voltage for the semiconductor device. Additionally, the combined structure permits a doubling of the electrical charge within the drift region of the trench drift structure to lower the drift region resistance and the drain-to-source on-resistance of the semiconductor device. The higher electrical charge or higher doping concentration within the drift region also improves the high side operation of the semiconductor device by preventing premature punch-through in the drift region.

Furthermore, the use of the upper RESURF layer improves the robustness of the semiconductor device by reducing the sensitivity of the semiconductor device to semiconductor substrate surface charges. The upper RESURF layer also prevents depletion effects, which originate from within the semiconductor substrate, from reaching the surface of the semiconductor substrate.

FIG. 1 illustrates a cross-sectional view of a portion of a semiconductor component 100. As explained in more detail hereinafter, the portion of semiconductor component 100 illustrated in FIG. 1 can represent portions of a single transistor or two transistors depending upon the specific configurations of various doped regions and electrical contacts and electrodes.

Component 100 comprises a substrate 110 having a surface 111. Prior to forming component 100 in substrate 110, surface 111 of substrate 110 preferably forms a substantially planar plane. In the preferred embodiment, substrate 110 is comprised of a semiconductor material. Accordingly, substrate 110 is also referred to as a semiconductor substrate.

As an example, substrate 110 can comprise a support substrate 113 supporting an overlying epitaxial layer 112. In a different embodiment, substrate 110 can consist only of a single semiconductor substrate or a single semiconductor layer. Also as an example, substrate 113 can be comprised of single crystal silicon having a first conductivity type, and layer 112 can be comprised of epitaxial silicon also having the first conductivity type. In other embodiments, substrate 110 can be comprised of other semiconductor materials such as, for example, germanium, silicon germanium, or gallium arsenide. Furthermore, substrate 113 can have a very high doping level or concentration, and layer 112 can be grown to have a low doping level or concentration. In the preferred embodiment, substrate 113 can be considered P++, and layer 112 can be considered P−.

Semiconductor component 100 also comprises a channel region 120 located in substrate 110. In particular, channel region 120 is illustrated in FIG. 1 to be located within layer 112 of substrate 110. At least a portion of channel region 120 is located at surface 111 of substrate 110. As an example, channel region 120 can have the first doping type, similar to layer 112 and substrate 113. Accordingly, in the preferred embodiment, the MOSFET of semiconductor component 100 is an n-channel device. Channel region 120 also has a predetermined doping level or concentration.

Semiconductor component 100 additionally comprises a non-electrically conductive region 130. In the preferred embodiment, non-electrically conductive region 130 is substantially located below the substantially planar plane defined by the original surface, or surface 111, of substrate 110. Non-electrically conductive region 130 can be a single continuous region encircling or circumscribing channel region 120. In a different embodiment, non-electrically conductive region 130 can be comprised of two separate regions. In the preferred embodiment, non-electrically conductive region 130 extends only partially into layer 112 of substrate 110 and does not extend into substrate 113 of substrate 110. At least a portion of non-electrically conductive region 130 is located at surface 111 of substrate 110.

Non-electrically conductive region 130 can be either electrically insulative or electrically semi-insulative. As an example, non-electrically conductive region 130 can be formed by etching a trench into surface 111 of substrate 110 and filling the trench with a semi-insulative or dielectric material such as silicon dioxide, silicon nitride, gallium arsenide, or a combination of such materials. In a different embodiment, non-electrically conductive region 130 can be formed by implanting a high dose of oxygen atoms into surface 111 of substrate 110. In the preferred embodiment, non-electrically conductive region 130 is not formed using a LOCal Oxidation of Silicon (LOCOS) process.

Semiconductor component 100 further comprises a doped region 140 located in substrate 110. In particular, doped region 140 is illustrated in FIG. 1 to be located within layer 112 of substrate 110. At least a portion of doped region 140 is located under channel region 120. Doped region 140 has a second doping type different from the first doping type of channel region 120 and substrate 110. As an example, doped region 140 can have an n-type conductivity.

A drift region 141 is located within doped region 140. Non-electrically conductive region 130 and drift region 141 form a trench drift structure. At least a portion of drift region 141 is located under non-electrically conductive region 130. Additionally, at least a portion of drift region 141 is located between channel region 120 and non-electrically conductive region 130, and at least a portion of drift region 141 is located at surface 111 of substrate 110.

Semiconductor component 100 still further comprises an electrically floating region 150 located in substrate 110. In particular, electrically floating region 150 is illustrated in FIG. 1 to be located in layer 112 of substrate 110. Electrically floating region 150 is preferably located only between non-electrically conductive region 130 and drift region 141. As illustrated in FIG. 1, electrically floating region 150 is contiguous with both non-electrically conductive region 130 and drift region 141. At least a portion of electrically floating region 150 is located between non-electrically conductive region 130 and channel region 120, and at least a portion of electrically floating region 150 is located underneath non-electrically conductive region 130. Electrically floating region 150 can be a single region encircling or circumscribing channel region 120. In a different embodiment, electrically floating region 150 can be comprised of two or several separate regions.

At least a portion of electrically floating region 150 is located at surface 111 of substrate 110. In particular, a portion of electrically floating region 150 at surface 111 of substrate 110 is located between a portion of drift region 141 at surface 111 of substrate 110 and a portion of non-electrically conductive region 130 at surface 111 of substrate 110. Accordingly, a portion of electrically floating region 150 is located at a corner or edge of non-electrically conductive region 130 at surface 111 of substrate 110. This configuration of electrically floating region 150 eliminates or at least reduces any leakage currents emanating from or originating at the corner or edge of non-electrically conductive region 130.

Electrically floating region 150 preferably has the first doping type of channel region 120 and substrate 110. The doping level or concentration within electrically floating region 150 can be different from or the same as the doping level or concentration within channel region 120. As an example, the doping concentration within electrically floating region 150 can be greater than or less than the doping concentration within channel region 120. In the preferred embodiment, however, the doping concentration within electrically floating region 150 is twenty-five to fifty percent of the doping concentration within channel region 120. Also in the preferred embodiment, electrically floating region 150 has a maximum doping concentration of approximately $1 \times 10^{17}$ atoms per centimeter-cubed.

Semiconductor component 100 further comprises a drain region 160 in substrate 110. In particular, drain region 160 is illustrated in FIG. 1 to be located within layer 112 of substrate 110. Non-electrically conductive region 130 is located between drain, region 160 and channel region 120. Electrically floating region 150 is also located between drain region 160 and channel region 120. Drain region 160 can be a single region encircling or circumscribing channel region 120, non-electrically conductive region 130, and electrically floating region 150. In a different embodiment, drain region 160 can be comprised of two separate regions.

As illustrated in FIG. 1, drain region 160 is located in substrate 110 adjacent to and contiguous with a side of non-electrically conductive region 130 facing away from channel region 120 and electrically floating region 150. At least a portion of drain region 160 is located at surface 111 of substrate 110. Drain region 160 has the second doping type of doped region 140. As an example, drain region 160 can have a high doping concentration and can be considered N+.

Semiconductor component 100 also comprises a source region 162 in substrate 110. In particular, source region 162 is illustrated in FIG. 1 to be located within layer 112 of substrate 110. Channel region 120 is located between source region 162 and drift region 141. Channel region 120 is also located between source region 162 and electrically floating region 150. Channel region 120 is further located between source region 162 and non-electrically conductive region 130. At least a portion of source region 162 is located at surface 111 of substrate 110. Similar to drain region 160, source region 162 has the second doping type, has a high doping concentration, and can be considered N+.

Semiconductor component 100 further comprises a drain contact 161 and a source contact 163. Drain contact 161 is located over surface 111 of substrate 110 and drain region 160. Drain contact 161 is electrically coupled to drain region 160. Source contact 163 is located over surface 111 of substrate 110 and source region 162. Source contact 163 is electrically coupled to source region 162.

Semiconductor component 100 additionally comprises a portion 170 of substrate 110. Portion 170 is located under channel region 120, non-electrically conductive region 130, doped region 140, drift region 141, electrically floating region 150, drain region 160, and source region 162. A portion of drift region 141 is located between electrically floating region 150 and portion 170. Portion 170 has the first doping type of channel region 120 and electrically floating region 150. As illustrated in FIG. 1, channel region 120 is electrically isolated from portion 170 by doped region 140.

Semiconductor component 100 also comprises a body region 171 located in substrate 110. In particular, body region 171 is illustrated in FIG. 1 to be located within layer 112 of substrate 110. Body region 171 is located over portion 170 of layer 112. Channel region 120 is located within body region 171. Accordingly, body region 171 has the first doping type. As illustrated in FIG. 1, body region 171 is electrically isolated from portion 170 by doped region 140.

A portion 173 of body region 171 has a high doping concentration to lower the contact resistance between a body contact 172 of component 100 and body region 171. Portion 173 of body region 171 can be considered P+. Body contact 172 is located over surface 111 of substrate 110 to be electrically coupled to body region 171 through portion 173. Source region 162 can be a single region encircling or circumscribing portion 173 of body region 171. In a different embodiment, source region 162 can be comprised of two separate regions.

Semiconductor component 100 additionally comprises a gate electrode 180 located over surface 111 of substrate 110. Gate electrode 180 is preferably located over at least a portion of channel region 120, non-electrically conductive region 130, drift region 141, electrically floating region 150, portion 170 of layer 112, and body region 171. Gate electrode 180 is also preferably located over at least a portion of source region 162, but is preferably not located over any portion of drain region 160. In an alternative embodiment, gate electrode 180 can be located over a portion of drain region 160. The location of gate electrode 180 over the edge or corner of electrically floating region 150 and also over the portion of electrically floating region 150 at surface 111 of substrate 110 adjacent to the edge or corner of electrically floating region 130 both (a) reduces or at least eliminates the leakage current at the edge or corner of non-electrically conductive region 130 and (b) improves the drain-to-source sustaining voltage of the MOSFET in semiconductor component 100.

In the preferred embodiment, gate electrode 180 is comprised of a dielectric layer underneath an electrically conductive layer. Gate electrode 180 can also comprise spacers located around a periphery of the electrically conductive layer. In a different embodiment, gate electrode 180 can be devoid of the dielectric material. In this embodiment, the semiconductor device in semiconductor component 100 can be a MEtal-Semiconductor Field Effect Transistor (MESFET).

Semiconductor component 100 also comprises non-electrically conductive regions 131, 132, and 133. Although not illustrated in FIG. 1, each of regions 131, 132, and 133 encircles or circumscribes channel region 120, non-electrically conductive region 130, doped region 140, drift region 141, electrically floating region 150, drain region 160, source region 162, body region 171, and portion 170 of layer 112. Non-electrically conductive regions 130, 131, 132, and 133 are preferably formed simultaneously with each other using a STI process. Drain region 160 is located between non-electrically conductive regions 130 and 131.

Semiconductor component 100 additionally comprises doped regions 164, 165, 191, 192, 193, 194, and 195. Although not illustrated in FIG. 1, each of doped regions 164, 165, 191, 192, 193, 194, and 195 encircles or circumscribes channel region 120, non-electrically conductive regions 130 and 131, doped region 140, drift region 141, electrically floating region 150, drain region 160, source region 162, portion 170 of layer 112, and body region 171.

Doped regions 165, 191, and 193 have the first doping type and electrically couple a substrate contact 197 to substrate 113 and to portion 170 of layer 112. Doped region 165 has a high doping concentration and is more heavily doped than doped region 191. Doped region 165 can be formed simultaneously with portion 173 of body region 171 and can be considered P+. Doped regions 165 and 191 are located between non-electrically conductive regions 131 and 132.

Doped regions 192 and 194 also have the first doping type. Doped regions 192 and 194 can be similar to doped regions 191 and 193, respectively. Doped regions 192 and 194 can also be formed simultaneously with doped regions 191 and 193, respectively.

Doped regions 164 and 195 have the second doping type and, when electrically biased by contact 196, form an electrically-biased isolation ring around the semiconductor device. Doped region 164 has a high doping concentration and is more heavily doped than doped region 195. Doped region 164 can be formed simultaneously with drain region 160 and source region 162 and can be considered N+. Doped regions 164 and 195 are located between non-electrically conductive regions 132 and 133.

In summary, semicomductor component 100 in FIG. 1 illustrates a single semiconductor device having a trench drift structure in combination with a double RESURF structure. Non-electrically conductive region 130 and drift region 141 form the trench drift structure, and electrically floating region 150 and portion 170 of layer 112 form the double RESURF structure. The use of the trench drift structure and the double RESURF structure enables the use of a higher doping concentration in doped region 140 to lower the drift region resistance and the drain-to-source on-resistance. As an example, the drain-to-source on-resistance of semiconductor component 100 can be at least as low as 0.5 milliohms-cm$^2$ for an n-channel MOSFET device with a sustaining voltage of 45 volts.

FIG. 2 illustrates a cross-sectional view of a semiconductor component 200, which is different embodiment of semiconductor component 100 in FIG. 1. Semiconductor component 200 in FIG. 2 is a bi-directional device and is symmetric about a line drawn through the center of the channel. Semiconductor component 100 in FIG. 1 is an uni-directional device and is symmetrical about a line drawn through a center of portion 173 in body region 171.

Semiconductor component 200 in FIG. 2 is similar to semiconductor component 100 in FIG. 1. Semiconductor component 200 in FIG. 2, however, has a different drift region, a different body region, and a different channel region. The drift, body, and channel regions are mainly different only in structure and/or location, but not in function. At least the drift region is also different in doping. In particular, semiconductor component 200 comprises a doped region 240 that has an opening in the middle in which a body region 271 is located. A drift region 241 is located in doped region 240, and a channel region 220 is located in body region 271. Doped region 240, non-electrically conductive region 130, and electrically floating region 150 can each be a single region encircling or circumscribing body region 271. In a different embodiment, doped region 241, non-electrically conductive region 130, and electrically floating region 150 can each be comprised of two separate regions. Furthermore, semiconductor component 200 comprises a portion 270 of layer 112, which is electrically coupled to channel region 220. Doped region 240 does not electrically isolate channel region 220 from portion 270 of layer 112. As a consequence, semiconductor component 200 does not include a separate top side body contact.

Semiconductor component 200 also comprises a drain region 260, a drain contact 261, a source region 262, and a source contact 263. Drain region 160, drain contact 261, source region 262, and source contact 263 in FIG. 2 are mainly different from drain region 160, drain contact 161, source region 162, and source contact 163, respectively, in FIG. 1 only in structure and/or location, but not in function. For example, drain region 260 and source region 262 in FIG. 2 do not encircle or circumscribe any portions of the semiconductor device. In an embodiment where drain region 160 in FIG. 1 has a stripe configuration, drain region 260 in FIG. 2 can be identical to drain region 160.

Semiconductor component 200 further comprises a gate electrode 280, which is mainly different from gate electrode 180 in FIG. 1 only in structure and/or location, but not in function. For example, unlike gate electrode 180 in FIG. 1, gate electrode 280 in FIG. 2 does not have a hole in which a source contact or top-side body contact is located. Gate electrode 280 does not overlie drain region 260 or source region 262, but does overlie at least portions of electrically floating region 150, drift region 241, and non-electrically conductive region 130.

FIG. 3 illustrates a cross-sectional view of a portion of a semiconductor component 300, which is also a different embodiment of semiconductor component 100 in FIG. 1. Semiconductor component 300 in FIG. 3 has an electrically floating region 350, which is mainly different from electrically floating region 150 in FIG. 1 only in doping and structure and/or location, but not in function. For example, electrically floating region 350 is located mainly only underneath non-electrically conductive region 130. Electrically floating region 350 is contiguous with non-electrically conductive region 130.

Electrically floating region 350 is not located at surface 111 of substrate 110. In particular, electrically floating region 350 is not located adjacent to a corner or edge of non-electrically conductive region 130 at surface 111 of substrate 110. Accordingly, semiconductor component 300 in FIG. 3 may have a higher magnitude leakage current than semiconductor component 100 in FIG. 1.

Figure 4:
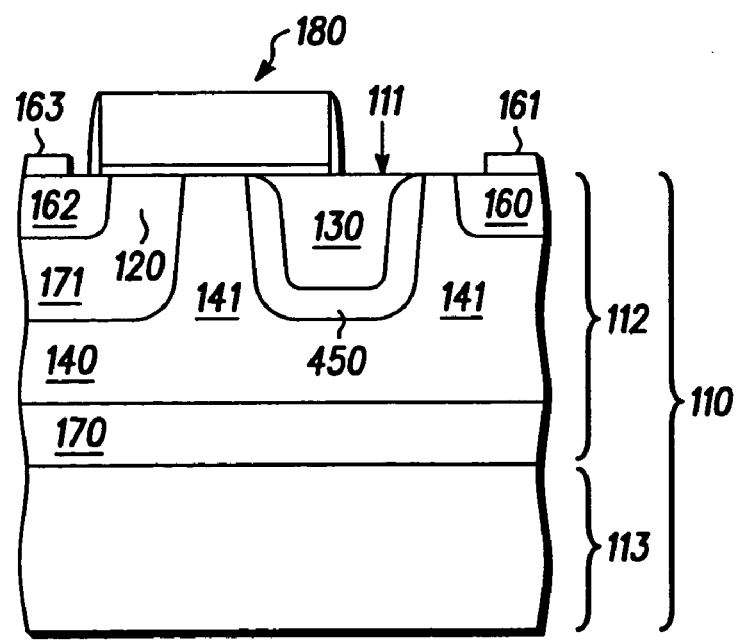
FIG. 4 illustrates a cross-sectional view of a portion of yet another semiconductor component in accordance with an embodiment of the invention.

FIG. 4 illustrates a cross-sectional view of a portion of a semiconductor component 400, which is a different embodiment of semiconductor component 100 in FIG. 1. Semiconductor component 400 in FIG. 4 has an electrically floating region 450, which is mainly different from electrically floating region 150 in FIG. 1 only in doping and structure and/or location, but not in function. For example, electrically floating region 450 surrounds non-electrically conductive region 130 within substrate 110. Electrically floating region 450 is located between non-electrically conductive region 130 and drain region 160. Electrically floating region 450 is also located between non-electrically conductive region 130 and channel region 120.

In the preferred embodiment of semiconductor component 400, electrically floating region 450 does not contact drain region 160. In particular, a portion of drift region 141 is located between electrically floating region 450 and drain region 160. Therefore, semiconductor component 400 in FIG. 4 is a larger device than semiconductor component 100 in FIG. 1, and semiconductor component 400 in FIG. 4 has a higher drain-to-source on-resistance than semiconductor component 100 in FIG. 1. In an alternative embodiment of semiconductor component 400, electrically floating region 450 can contact drain region 160, but even this embodiment of semiconductor component 400 is larger than and has a higher drain-to-source on-resistance than semiconductor component 100 in FIG. 1.

Figure 5:
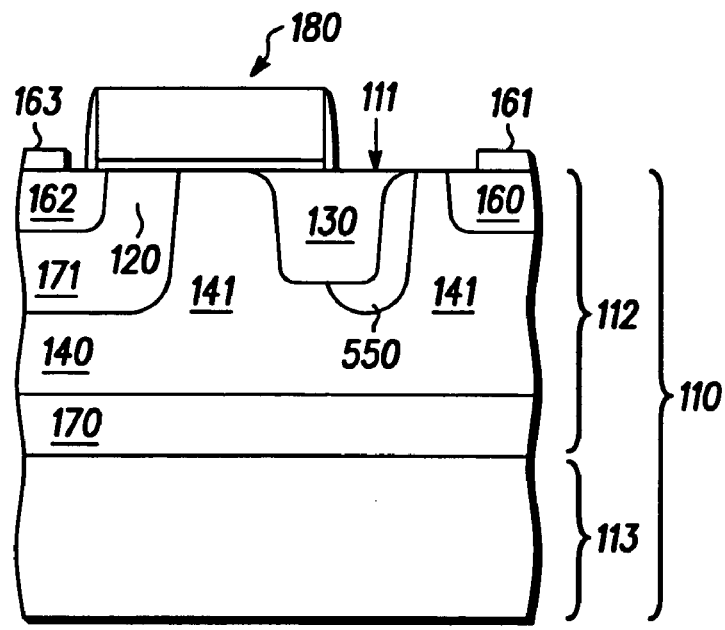
FIG. 5 illustrates a cross-sectional view of a portion of still another semiconductor component in accordance with an embodiment of the invention.

FIG. 5 illustrates a cross-sectional view of a portion of a semiconductor component 500, which is a different embodiment of semiconductor component 100 in FIG. 1. Semiconductor component 500 in FIG. 5 has an electrically floating region 550, which is mainly different from electrically floating region 150 in FIG. 1 only in doping and structure and/or location, but not in doping or function. For example, electrically floating region 550 is located between non-electrically conductive region 130 and drain region 160 and is not located between non-electrically conductive region 130 and channel region 120. Semiconductor component 500 in FIG. 5 may have a higher magnitude leakage current than semiconductor component 100 in FIG. 1. A portion of electrically floating region 550 is still located underneath non-electrically conductive region 130.

Figure 6:
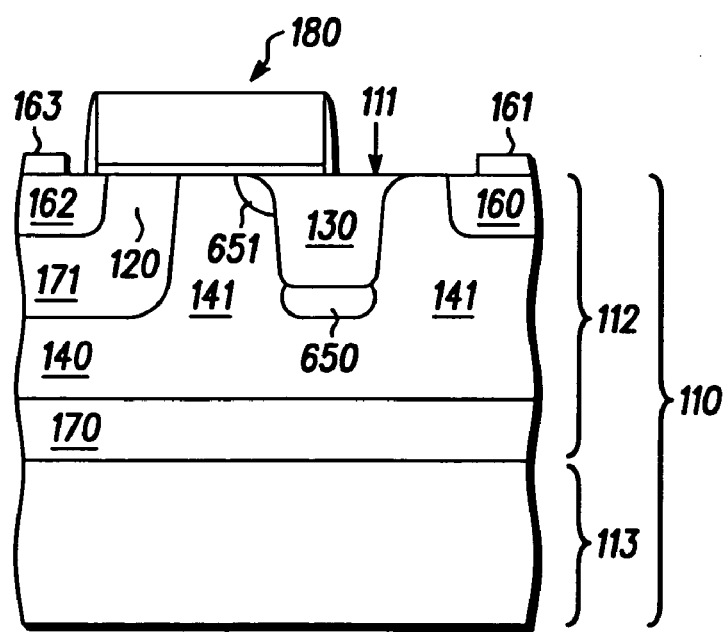
FIG. 6 illustrates a cross-sectional view of a portion of a further semiconductor component in accordance with an embodiment of the invention.

FIG. 6 illustrates a cross-sectional view of a portion of a semiconductor component 600, which is a different embodiment of semiconductor component 100 in FIG. 1. Semiconductor component 600 in FIG. 6 has an electrically floating region, which is mainly different from electrically floating region 150 in FIG. 1 only in doping and structure and/or location, but not in function. The electrically floating region of semiconductor component 500 is comprised of two separate portions 650 and 651. Portion 650 can be similar to electrically floating region 350 of component 300 in FIG. 3. The addition of portion 651 in component 600 of FIG. 6 eliminates the potential leakage current disadvantage of component 300 in FIG. 3. Portion 651 in component 600 of FIG. 6 can also be added to component 500 of FIG. 5 for the same reason.

FIG. 7 illustrates a flowchart 700 for a method of manufacturing a semiconductor component. As an example, the semiconductor component can be similar to semiconductor components 100, 200, 300, 400, 500, and/or 600 of FIGS. 1, 2, 3, 4, 5, and 6, respectively. At a step 705 of flowchart 700, a substrate having a surface is provided. As an example, the substrate and the surface of step 705 can be similar to substrate 110 and surface 111, respectively, in FIGS. 1, 2, 3, 4, 5, and 6. When the substrate of step 705 comprises an epitaxial layer, the dopant in the epitaxial layer forms a portion of the semiconductor device. This portion of the semiconductor device is similar to portion 170 in FIGS. 1, 3, 4, 5, and 6 and is also similar to portion 270 in FIG. 2.

Next, at a step 710 of flowchart, 700 in FIG. 7, a non-electrically conductive region is formed to be substantially located below a substantially planar plane defined by the surface of the substrate. As an example, the non-electrically conductive region of step 710 can be similar to non-electrically conductive region 130 in FIGS. 1, 2, 3, 4, 5, and 6. Step 710 also simultaneously forms non-electrically conductive regions 131, 132, and 133 with non-electrically conductive region 130.

In the preferred embodiment, step 710 is performed using a STI process. For example, trenches can be etched into surface 111 of substrate 110, and then a thermal liner oxide layer can be formed along the walls of the trenches. Subsequently, silicon dioxide can be deposited to fill the trenches, and then the silicon dioxide can be densified and planarized. Other techniques can also be used to form the non-electrically conductive regions of step 710. The non-electrically conductive region of step 710, however, is preferably not formed by using a LOCOS process.

Then, at a step 715 of flowchart 700 in FIG. 7, a doped region is formed in the substrate. A drift region is located in the doped region. As an example, the doped region of step 715 can be similar to doped region 140 in FIGS. 1, 3, 4, 5, and 6, and can also be similar to doped region 240 in FIG. 2. Step 715 can be performed by, for example, forming an implant mask over the surface of the substrate and implanting a dopant into the substrate. A single implant or a plurality of implants with varying implant doses and energies can be used with the implant mask to form the drift region.

At a step 720 of flowchart 700, a body region is formed in the substrate. A channel region is located in the body region. The drift region can be located between the channel region and the non-electrically conductive region. As an example, the body region of step 720 can be similar to body region 171 in FIGS. 1, 3,4, 5, and 6, and can also be similar to body region 271 in FIG. 2. Step 720 can be performed by, for example, forming an implant mask over the surface of the substrate and implanting a dopant into the substrate. A single implant or a plurality of implants at different implant doses and different implant energies can be performed with the implant mask to form the channel region.

Next, at a step 725 of flowchart 700 in FIG. 7, an electrically floating region is formed in the substrate. The electrically floating region is preferably contiguous with the non-electrically conductive region of step 710. As an example, the electrically floating region of step 725 can be similar to electrically floating region 150 in FIGS. 1 and 2, electrically floating region 350 in FIG. 3, electrically floating region 450 in FIG. 4, electrically floating region 550 in FIG. 5, or portions 650 and 651 of the electrically floating region in FIG. 6. The formation of the electrically floating region in step 725 of FIG. 7 can be performed by forming an implant mask over the surface of the substrate and implanting a dopant into the substrate. A single implant or a plurality of implants having different implant doses and different implant energies can be used with a single or a plurality of implant masks to form the electrically floating region.

In one embodiment, steps 720 and 725 are performed simultaneously with each other. Accordingly, the body region and the electrically floating region can be formed simultaneously with each other. Therefore, a single implant mask can be used to define the body region and the electrically floating region. Similarly, the same implant or a single set of implants can be used to form the body region and the electrically floating region.

Then, at a step 730 of flowchart 700 in FIG. 7, additional doped regions are formed in the substrate. Examples of these additional doped regions can include regions 191, 192, 193, 194, and 195 in FIGS. 1 and 2. In the preferred embodiment, regions 193 and 194 are formed simultaneously with each other and before the formation of regions 191 and 192. Regions 191 and 192 are also preferably formed simultaneously with each other. Regions 191, 192, 193, and 194 are preferably formed using a single implant mask. A different implant mask is used to form region 195, which can be formed before or after regions 191, 192, 193, and 194.

At a step 735 of flowchart 700 in FIG. 7, a gate electrode is formed over the surface of the substrate. As an example, the gate electrode of step 735 can be similar to gate. electrode 180 in FIGS. 1, 3, 4, 5, and 6, and can also be similar to gate electrode 280 in FIG. 2. Step 735 can be performed by, for example, forming a gate oxide layer over the surface of the substrate and forming a doped polysilicon layer over the gate oxide layer. Next, this structure can be etched, and then spacers can be formed around the etched structure.

At a step 740 of flowchart 700 in FIG. 7, source and drain regions are formed in the substrate. The gate electrode can also be implanted simultaneously with the source and drain regions in step 740. As an example, the source region and the drain region in step 740 can be similar to source region 162 and drain region 160, respectively, in FIGS. 1, 3, 4, 5, and 6, and can also be similar to source region 262 and drain region 260, respectively, in FIG. 2. Step 740 can be performed by, for example, forming an implant mask over the surface of the substrate and the gate electrode and implanting a dopant into the substrate and the gate electrode. In the preferred embodiment, the source and drain regions are simultaneously formed with each other and with the doping of the gate electrode such that a single implant mask and a single implant can be used to simultaneously form the source and drain regions and dope the gate electrode. Also in the preferred embodiment, region 164 in FIGS. 1 and 2 is simultaneously formed with the source and drain regions and with the doping of the gate electrode. A different implant mask and implant process is used to simultaneously form regions 165 and 173 in FIG. 1.

Subsequently, at a step 745 of flowchart 700 in FIG. 7, additional electrical contacts are formed over the surface of the substrate. As an example, the electrical contacts of step 745 can include drain contact 161 and source contact 163 of FIGS. 1, 3, 4, 5, and 6 can also include drain contact 261 and source contact 263 of FIG. 2, and can further include gate contacts located over the gate electrodes in FIGS. 1, 2, 3, 4, 5, and 6. The electrical contacts of step 745 can further include body contact 172 in FIG. 1 and contact 196 and substrate contact 197 in FIGS. 1 and 2. Step 745 can be performed by, for example, performing a self-aligned silicide, or salicide, process. In the preferred embodiment, each of the electrical contacts of step 745 are formed simultaneously with each other.

Next, at a step 750 of flowchart 700 in FIG. 7, an interconnect system is formed over the semiconductor device and also over the surface of the substrate. The interconnect system of step 750 can be a single-layered interconnect system or a multi-level interconnect system. Both types of interconnect systems are known in the art.

Next, at a step 755 of flowchart 700 in FIG. 7, an opposite surface or back surface of the substrate is processed. As an example, the back surface of the substrate can be thinned, and then a metal layer can be formed over the back surface of the substrate. This metal layer can serve as a back metal for mounting the semiconductor component onto, for example, a lead frame.

Although the invention has been described with reference to specific embodiments, it will be understood by those skilled in the art that various changes may be made without departing from the spirit or scope of the invention. For instance, the numerous details set forth herein such as, for example, the doping types, the doping concentrations, and the material compositions are provided to facilitate the understanding of the invention and are not provided to limit the scope of the invention. For example, the doping types of the various regions within substrate 110 in FIG. 1 can be reversed where the first doping type is changed to the second doping type and where the second doping type is changed to the first doping type. Additionally, a single semiconductor component can have both types of semiconductor devices. As an additional example, the modifications to semiconductor component 100 in FIG. 1 that are described in FIGS. 3, 4, 5, and 6 can also be made to semiconductor component 200 in FIG. 2. Accordingly, the disclosure of embodiments of the invention is intended to be illustrative of the scope of the invention and is not intended to be limiting. It is intended that the scope of the invention shall be limited only to the extent required by the appended claims.

The invention claimed is:

1. A method of manufacturing a semiconductor component comprising:
   providing a substrate having a surface;
   forming by a non LOCal Oxidation of Silicon (LOCOS) process, a non-electrically conductive region substantially located below a substantially planar plane defined by the surface of the substrate;
   forming a drift region in the substrate;
   forming a channel region in the substrate, at least a portion of the drift region located between the channel region and the non-electrically conductive region; and
   forming an electrically floating region in the substrate and contiguous with the non-eletrically conductive region;
   wherein at least a portion of the electrically floating region is located between the non-electrically conductive region and the channel region, at least a portion of the electrically floating region is located laterally with respect to the non-electrically conductive region, and at least a portion of the electrically floating region is located underneath the non-electrically conductive region.

2. The method of claim 1 wherein forming the channel region and forming the electrically floating region occur simultaneously with each other.

3. The method of claim 1 wherein the forming by a non LOCal Oxidation of Silicon (LOCOS) process, the non-electrically conductive region further comprises:
   etching a trench into the surface of the substrate; and
   filling the trench with a material.

4. The method of claim 3 wherein the material includes a semi insulative material.

5. The method of claim 3 wherein the material includes a dielectric material.

6. The method of claim 3 wherein the material includes at least one of silicon dioxide, silicon nitride, and gallium arsenide.

7. The method of claim 3 further comprising:
   forming a thermal liner oxide layer along walls of the trench prior to the filling.

8. The method of claim 3 further comprising:
   densifying the material.

9. The method of claim 3 further comprising:
   planarizing the material.

10. The method of claim 1 wherein the forming by a non LOCal Oxidation of Silicon (LOGCS) process, the non-electrically conductive region further includes implanting a dose of oxygen into the surface at a substrate at location corresponding to non-electrically conductive region.

11. A method of manufacturing a semiconductor component comprising:
    providing a substrate having a surface;
    forming by a non LOCal Oxidation of Silicon (LOCOS) process, a non-electrically conductive region substantially located below a substantially planar plane defined by the surface of the substrate;
    forming a drift region in the substrate;
    forming a channel region in the substrate, at least a portion of the drift region located between the channel region and the non-electrically conductive region; and
    forming an electrically floating region in the substrate and contiguous with the non-electrically conductive region;
    wherein at least a portion of the channel region, at least a portion of the non-electrically conductive region, at least a portion of the drift region, and at least a portion of the electrically floating region are located at the surface of the substrate.

12. The method of claim 1 wherein at least a portion of the electrically floating region is located between the drift region and the non-electrically conductive region.

13. The method of claim 12 wherein at least a portion of the channel region, at least a portion of the non-electrically conductive region, at least a portion of the drift region, and at least a portion of the electrically floating region are located at the surface of the substrate.

14. The method of claim 13 wherein a portion of the electrically floating region at the surface of the substrate is located between a portion of the drift region at the surface of the substrate and a portion of the non-electrically conductive region at the surface of the substrate.

15. A method of manufacturing a semiconductor component comprising:
    providing a substrate having a surface;
    forming by a non LOCal Oxidation of Silicon (LOCOS) process, a non-electrically conductive region substantially located below a substantially planar plane, defined by the surface of the substrate;
    forming a drift region in the substrate;
    forming a channel region in the substrate, at least a portion of the drift region located between the channel region and the non-electrically conductive region; and
    forming an electrically floating region in the substrate and contiguous with the non-electrically conductive region;
    forming a drain region in the substrate;

wherein:
  the non-electrically conductive region is located between the drain region and the channel region; and
  at least a portion of the electrically floating region at the surface of the substrate is located between the non-electrically conductive region and the drain region.

16. The method of claim 15 wherein at least a portion of the channel region, at least a portion of the non-electrically conductive region, at least a portion of the drift region, and at least a portion of the electrically floating region are located at the surface of the substrate.

17. The method of claim 1 wherein at least a portion of the channel region, at least a portion of the non-electrically conductive region, at least a portion of the drift region, and at least a portion of the electrically floating region are located at the surface of the substrate.

18. The method of claim 1 wherein the channel region is electrically isolated from a portion of the substrate located underneath the channel region.

19. A method of manufacturing a semiconductor component comprising:
  providing a substrate having a surface;
  forming by a non LOCal Oxidation of Silicon (LOCOS) process, a non-electrically conductive region substantially located below a substantially planar plane defined by the surface of the substrate;
  forming a drift region in the substrate;
  forming a channel region in the substrate, at least a portion of the drift region located between the channel region and the non-electrically conductive region; and
  forming an electrically floating region in the substrate and contiguous with the non-electrically conductive region;
  wherein the channel region is electrically coupled to a portion of the substrate located underneath the channel region;
  wherein at least a portion of the channel region, at least a portion of the non-electrically conductive region, at least a portion of the drift region, and at least a protion of the electrically floating region are located at the surface of the substrate.

20. The method of claim 19 wherein the electrically floating region is located between the drift region and the non-electrically conductive region.

21. The method of claim 19 wherein at least a portion of the electrically floating region is located underneath the non-electrically conductive region.

22. The method of claim 19 wherein the electrically floating region is located only underneath the non-electrically conductive region.

23. The method of claim 19 wherein at least a portion of the electrically floating region is located between the non-electrically conductive region and the channel region and at least a portion of the electrically floating region is located underneath the non-electrically conductive region.

24. The method of claim 1 further comprising:
  forming a gate electrode over the surface of the substrate, wherein:
    the channel region is located under the gate electrode;
    the drift region is located at least partially under the gate electrode; and
    the electrically floating region is located at least partially under the gate electrode.

25. The method of claim 24 wherein:
  the electrically floating region has a doping type;
  the drift region has an other doping type different from the doping type of the electrically floating region and is located under the electrically floating region, and
  a portion of the substrate has the doping type of the electrically floating region and is located under the drift region and under the electrically floating region.

26. The method of claim 25 wherein the electrically floating region is located under the non-electrically conductive region.

27. The method of claim 25 wherein the non-electrically conductive region is located under the gate electrode.

28. The method of claim 1 wherein:
  the electrically floating region has a doping type;
  the drift region has an other doping type different from the doping type of the electrically floating region and is located at least partially under the electrically floating region, and
  a portion of the substrate has the doping type of the electrically floating region and is located at least partially under the drift region and located at least partially under the electrically floating region.

29. The method of claim 11 wherein:
  the electrically floating region comprises a first portion and a second portion;
  the first portion of the electrically floating region is located at least partially underneath the non-electrically conductive region; and
  the second portion of the electrically floating region includes a portion that is located at the surface of the substrate between a portion of the drift region at the surface of the substrate and a portion of the non-electrically conductive region at the surface of the substrate.

30. The method of claim 29 wherein the first portion of the electrically floating region is separate from the second portion of the electrically floating region.

31. The method of claim 1 further comprising:
  forming a gate dielectric over at least a portion of the non-electrically conductive region.

32. The method of claim 1 wherein at least a portion of the electrically floating region is located laterally between the non-electrically conductive region and the channel region.

* * * * *